United States Patent
Tseng et al.

(10) Patent No.: US 9,129,574 B2
(45) Date of Patent: Sep. 8, 2015

(54) GATE DRIVING CIRCUIT WITH AN AUXILIARY CIRCUIT FOR STABLIZING GATE SIGNALS

(75) Inventors: Chien-Chang Tseng, Hsin-Chu (TW); Kuang-Hsiang Liu, Hsin-Chu (TW); Ya-Ting Yang, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 442 days.

(21) Appl. No.: 13/441,940

(22) Filed: Apr. 9, 2012

(65) Prior Publication Data

US 2013/0127797 A1 May 23, 2013

(30) Foreign Application Priority Data

Nov. 18, 2011 (TW) .............................. 100142451 A

(51) Int. Cl.
*G09G 3/36* (2006.01)
*G11C 19/28* (2006.01)

(52) U.S. Cl.
CPC .............. *G09G 3/3674* (2013.01); *G11C 19/28* (2013.01); *G09G 2310/0286* (2013.01); *G09G 2310/08* (2013.01)

(58) Field of Classification Search
CPC ....................... G09G 2310/0286; G09G 3/3677
USPC .................. 345/87–100, 204–205; 377/64–81
See application file for complete search history.

(56) References Cited

U.S. PATENT DOCUMENTS

| | | | |
|---|---|---|---|
| 8,019,039 B1 | 9/2011 | Tsai | |
| 2007/0104307 A1* | 5/2007 | Kim et al. | 377/64 |
| 2007/0164967 A1 | 7/2007 | Osame | |
| 2007/0216634 A1* | 9/2007 | Kim et al. | 345/100 |
| 2008/0224985 A1* | 9/2008 | Jang | 345/100 |
| 2010/0177068 A1* | 7/2010 | Shih et al. | 345/204 |
| 2010/0245301 A1 | 9/2010 | Shang | |
| 2010/0245305 A1* | 9/2010 | Yokoyama et al. | 345/205 |
| 2011/0058642 A1* | 3/2011 | Tsai et al. | 377/79 |
| 2011/0091006 A1 | 4/2011 | Liu | |

FOREIGN PATENT DOCUMENTS

| | | |
|---|---|---|
| CN | 101000747 | 7/2007 |
| CN | 101853705 | 10/2010 |
| TW | 200709166 | 3/2007 |
| TW | 201141063 | 11/2011 |

* cited by examiner

*Primary Examiner* — Jonathan Boyd
*Assistant Examiner* — James Nokham
(74) *Attorney, Agent, or Firm* — Winston Hsu; Scott Margo

(57) ABSTRACT

A gate driving circuit includes a shift register circuit and an auxiliary circuit which are disposed at different sides of a pixel array. The shift register circuit includes an (N−1)th shift register stage for generating an (N−1)th gate signal according to a first clock, an Nth shift register stage for generating an Nth gate signal according to a second clock, and an (N+1)th shift register stage for generating an (N+1)th gate signal according to a third clock. The auxiliary circuit includes a first transistor. The first transistor performs the signal voltage stabilization and level switching acceleration operations on the Nth gate signal according to the (N−1)th gate signal and the second clock.

12 Claims, 8 Drawing Sheets

GATE DRIVING CIRCUIT WITH AN AUXILIARY CIRCUIT FOR STABLIZING GATE SIGNALS

BACKGROUND OF THE INVENTION

1. Field of the Invention

The present invention relates to gate driving circuits, and particularly to a gate driving circuit and related gate driving method having signal voltage stabilization and level switching acceleration mechanisms.

2. Description of the Prior Art

Flat screen displays have the advantage of small physical volume. For example, liquid crystal displays (LCDs) are a type of flat screen display currently used widely. LCDs have advantages of thin exterior, low power consumption, and zero radiation. LCDs operate by changing voltage across two terminals of a liquid crystal layer to alter arrangement of liquid crystal molecules within the liquid crystal layer, so as to change transparency of the liquid crystal layer, and display an image using light provided by a backlight module. Generally speaking, an LCD device comprises a pixel array having a plurality of pixel units, a source driving circuit, and a gate driving circuit. The source driving circuit is used for providing a plurality of data signals to the plurality of pixel units. The gate driving circuit comprises a plurality of shift register stages for generating a plurality of gate signals fed into the plurality of pixel units, and thereby controlling writing of the plurality of data signals. Thus, the gate driving circuit controls key components related to data writing. However, after the gate driving circuit feeds the plurality of gate signals into the pixel array, a pulse of each gate signal will be distorted due to parasitic resistance and capacitance of a gate line. And, pulse distortion increases with increased pulse transmission distance, which shrinks pixel recharge time, thereby reducing image display quality. If two source driving circuits are disposed on two sides of the pixel array, and each gate signal is inputted from the two sides of the pixel array to reduce pulse distortion, border regions of the two sides of the display panel must have sufficiently large area to dispose the two source driving circuits, which not only adds cost, but also reduces design flexibility. Additionally, in operation of the gate driving circuit, a pull-down transistor of each shift register stage stays in the conducting state for a long time in each frame period, which causes transistor characteristic curve drift and lowers operating stability.

SUMMARY OF THE INVENTION

According to an embodiment, a gate driving circuit is for providing a plurality of gate signals to a plurality of gate lines of a pixel array. The gate driving circuit comprises a shift register circuit disposed on a first side of the pixel array. The shift register circuit feeds the gate signals from the first side into the pixel array. The shift register circuit comprises an (N−1)th shift register stage electrically connected to an (N−1)th gate line of the gate lines, the (N−1)th shift register stage used for according to a first clock generating an (N−1)th gate signal of the gate signals, an Nth shift register stage electrically connected to an Nth gate line of the gate lines, the Nth shift register stage used for generating an Nth gate signal of the gate signals according to a second clock, and an (N+1)th shift register stage electrically connected to an (N+1)th gate line of the gate lines, the (N+1)th shift register stage used for generating an (N+1)th gate signal of the gate signals according to a third clock. An auxiliary circuit is disposed on a second side of the pixel array different from the first side. The auxiliary circuit comprises a first transistor having a first terminal used for receiving the second clock, a gate terminal electrically connected to the (N−1)th gate line, and a second terminal electrically connected to the Nth gate line.

According to an embodiment, a gate driving circuit for providing a plurality of gate signals to a plurality of gate lines of a pixel array comprises a shift register circuit disposed on a first side of the pixel array, the shift register circuit feeding the gate signals into the pixel array from the first side. The shift register circuit comprises an (N−1)th shift register stage electrically connected to an (N−1)th gate line of the gate lines, the (N−1)th shift register stage used for generating an (N−1)th gate signal of the gate signals according to a first clock, an Nth shift register stage electrically connected to an Nth gate line of the gate lines, the Nth shift register stage for generating an Nth gate signal of the gate signals according to a second clock, and an (N+1)th shift register stage electrically connected to an (N+1)th gate line of the gate lines, the (N+1)th shift register stage for generating an (N+1)th gate signal of the gate signals according to a third clock. An auxiliary circuit is disposed on a second side of the pixel array different from the first side. The auxiliary circuit comprises a first transistor having a first terminal used for receiving the first clock, a gate terminal electrically connected to the Nth gate line, and a second terminal electrically connected to the (N−1)th gate line.

According to an embodiment, a gate driving method is for use in driving a gate driving circuit having a shift register circuit and an auxiliary circuit. The shift register circuit is used for providing a plurality of gate signals to a pixel array, and the shift register circuit and the auxiliary circuit are disposed on two different sides of the pixel array. The gate driving method comprises: in a first period, the shift register circuit outputting an (N−1)th gate signal having first level and an Nth gate signal having a second level of the gate signals to the pixel array and the auxiliary circuit, where the second level is different from the first level; in the first period, the auxiliary circuit stabilizing the Nth gate signal to the second level according to the (N−1)th gate signal having the first level and a first clock having the second level; in a second period after the first period, the shift register circuit outputting the (N−1)th gate signal having the first level and the Nth gate signal having the first level to the pixel array and the auxiliary circuit; in the second period, the auxiliary circuit performing accelerated switching of the Nth gate signal from the second level to the first level according to the (N−1)th gate signal having the first level and the first clock having the first level; in a third period following the second period, the shift register circuit outputting the (N−1)th gate signal having the first level and the Nth gate signal having the first level to the pixel array and the auxiliary circuit; and in the third period, the auxiliary circuit stabilizing the Nth gate signal to the first level according to the (N−1)th gate signal having the first level and the first clock having the first level.

According to an embodiment, a gate driving method is for use in driving a gate driving circuit having a shift register circuit and an auxiliary circuit. The shift register circuit is for providing a plurality of gate signals to a pixel array, and the shift register circuit and the auxiliary circuit are disposed on two different sides of the pixel array. The gate driving method comprises: in a first period, the shift register circuit outputting an (N+1)th gate signal having a first level and an Nth gate signal having the first level of the gate signals to the pixel array and the auxiliary circuit; in the first period, the auxiliary circuit stabilizing the Nth gate signal to the first level according to the (N+1)th gate signal having the first level and a first clock having the first level; in a second period after the first period, the shift register circuit outputting the (N+1)th gate signal having the first level and the Nth gate signal having a second level to the pixel array and the auxiliary circuit, where the second level is different from the first level; in the second period, the auxiliary circuit performing accelerated switching of Nth gate signal from the first level to the second level according to the (N+1)th gate signal having the first level and the first clock having the second level; in a third period after the second period, the shift register circuit outputting the (N+1)th gate signal having the first level and the Nth gate signal having the second level to the pixel array and the auxiliary circuit; and in the third period, the auxiliary circuit stabilizing the Nth gate signal to the second level according to the (N+1)th gate signal having the first level and the first clock having the second level.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
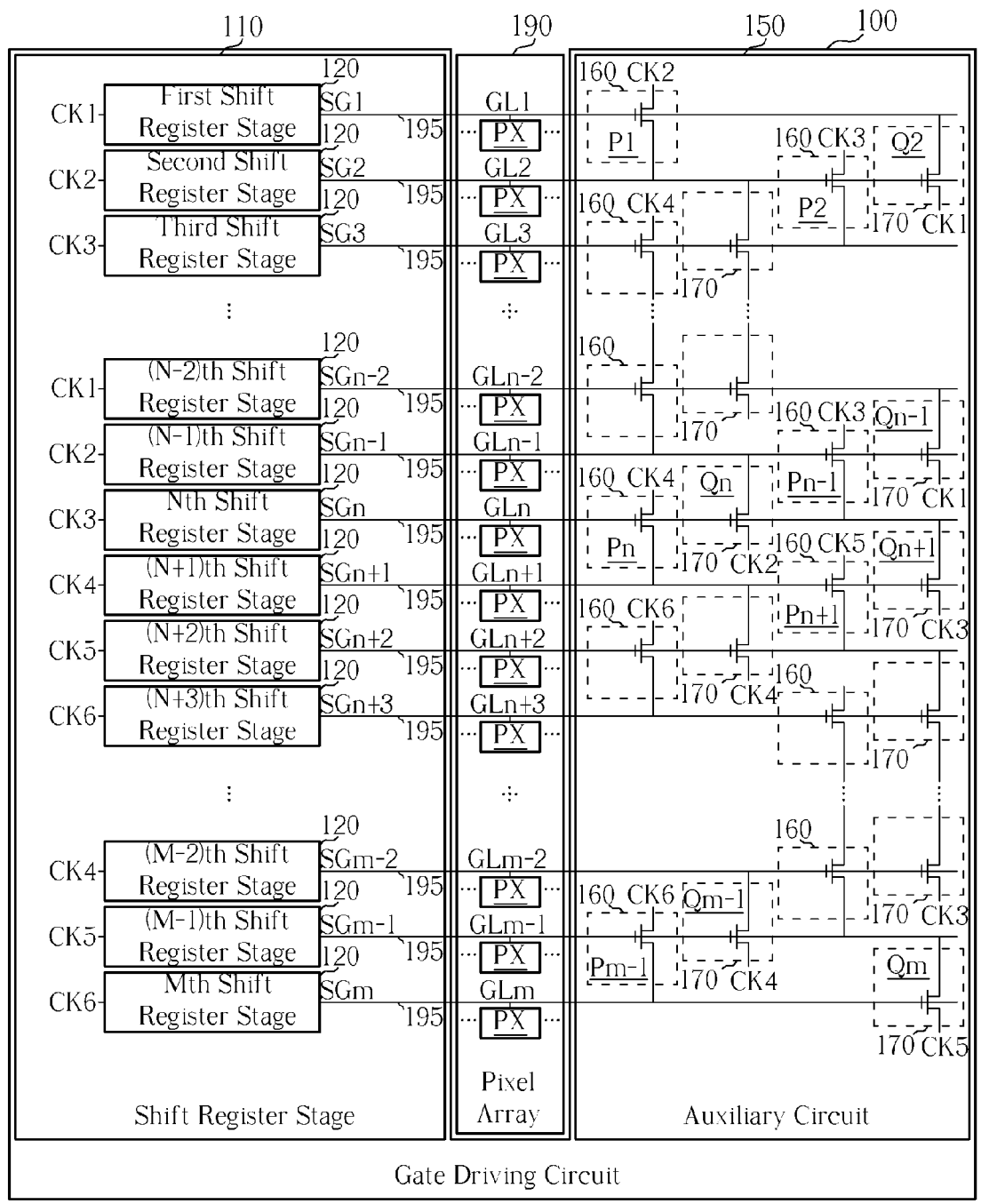
FIG. 1 is a circuit diagram of a gate driving circuit according to an embodiment.

In the following, a gate driving circuit and related gate driving method are described in embodiments with reference to the figures. However, the embodiments are not intended to limit the scope of the present invention. Method step reference numerals are not intended to limit order of execution, and any equivalent method generated by rearranging the method steps is also considered part of the scope of the present invention.

FIG. 1 is a circuit diagram of a gate driving circuit according to an embodiment. As shown in FIG. 1, gate driving circuit 100 comprises shift register circuit 110 and auxiliary circuit 150. Gate driving circuit 100 is used for providing a plurality of gate signals SG1-SGm to a plurality of gate lines 195 of pixel array 190. Shift register circuit 110 disposed on a first side of pixel array 190 is used for feeding a plurality of gate signals SG1-SGm from the first side of pixel array 190 to a plurality of pixels PX, and then transmitting through a second side to auxiliary circuit 150 through pixel array 190. Auxiliary circuit 150 is disposed on the second side of pixel array 190, which is different from the first side, for performing signal voltage stabilization and level switching acceleration on a plurality of gate signals SG1-SGm. Shift register circuit 110 comprises a plurality of shift register stages 120, each shift register stage 120 used for generating a corresponding gate signal according to a corresponding clock to be fed into a corresponding gate line 195. For convenience of description, FIG. 1 shows the first through third shift register stages, (N−2)th through (N+3)th shift register stages, and (M−2)th through Mth shift register stages, where N is greater than 5, and M is greater than (N+5). Auxiliary circuit 150 comprises a plurality of first auxiliary transistors 160 and a plurality of second auxiliary transistors 170. Each first auxiliary transistor 160 is used for performing signal voltage stabilization and level switching acceleration on the next-stage gate signal according to a corresponding gate signal and a corresponding clock. Each second auxiliary transistor 170 is used for performing signal voltage stabilization and level switching acceleration on the previous-stage gate signal according to a corresponding gate signal and a corresponding clock. Additionally, the first side and the second side may be, for example, two opposite sides or two neighboring sides, and gate driving circuit 100 is disposed in a panel comprising pixel array 190.

For example, first shift register stage 120 electrically connected to gate line GL1 is used for generating gate signal SG1 fed into gate line GL1 according to clock CK1, and first auxiliary transistor P1 electrically connected to gate line GL1 and gate line GL2 performs signal voltage stabilization and level switching acceleration on gate signal SG2 according to gate signal SG1 and clock CK2. Second shift register stage 120 electrically connected to gate line GL2 is used for generating gate signal SG2 fed into gate line GL2 according to clock CK2. First auxiliary transistor P2 electrically connected to gate line GL2 and gate line GL3 performs signal voltage stabilization and level switching acceleration on gate signal SG3 according to gate signal SG2 and clock CK3. Second auxiliary transistor Q2 electrically connected to gate line GL2 and gate line GL1 performs signal voltage stabilization and level switching acceleration on gate signal SG1 according to gate signal SG2 and clock CK1.

(N−1)th shift register stage 120 electrically connected to gate line GLn−1 is used for generating gate signal SGn−1 fed into gate line GLn−1 according to clock CK2. First auxiliary transistor Pn−1 electrically connected to gate line GLn−1 and gate line GLn performs signal voltage stabilization and level switching acceleration on gate signal according to gate signal SGn−1 and clock CK3 SGn. Second auxiliary transistor Qn−1 electrically connected to gate line GLn−1 and gate line GLn−2 performs signal voltage stabilization and level switching acceleration on gate signal SGn−2 according to gate signal SGn−1 and clock CK1. Nth shift register stage 120 electrically connected to gate line GLn is used for generating gate signal SGn fed into gate line GLn according to clock CK3. First auxiliary transistors Pn electrically connected to gate line GLn and gate line GLn+1 performs signal voltage stabilization and level switching acceleration on gate signal SGn+1 according to gate signal SGn and clock CK4. Second auxiliary transistor Qn electrically connected to gate line GLn and gate line GLn−1 performs signal voltage stabilization and level switching acceleration on gate signal SGn−1 according to gate signal SGn and clock CK2. (N+1)th shift register stage 120 electrically connected to gate line GLn+1 is used for generating gate signal SGn+1 fed into gate line GLn+1 according to clock CK4. First auxiliary transistor Pn+1 electrically connected to gate line GLn+1 and gate line GLn+2 performs signal voltage stabilization and level switching acceleration on gate signal SGn+2 according to gate signal SGn+1 and clock CK5. Second auxiliary transistor Qn+1 electrically connected to gate line GLn+1 and gate line GLn performs signal voltage stabilization and level switching acceleration on gate signal SGn according to gate signal SGn+1 and clock CK3.

(M−1)th shift register stage 120 electrically connected to gate line GLm−1 is used for generating gate signal SGm−1 fed into gate line GLm−1 according to clock CK5. First auxiliary transistors Pm−1 electrically connected to gate line GLm−1 and gate line GLm performs signal voltage stabilization and level switching acceleration on gate signal SGm according to gate signal SGm−1 and clock CK6. Second auxiliary transistor Qm−1 electrically connected to gate line GLm−1 and gate line GLm−2 performs signal voltage stabilization and level switching acceleration on gate signal SGm−2 according to gate signal SGm−1 and clock CK4. Mth shift register stage 120 electrically connected to gate line GLm is used for generating gate signal SGm fed into gate line GLm according to clock CK6. Second auxiliary transistor Qm electrically connected to gate line GLm and gate line GLm−1 performs signal voltage stabilization and level switching acceleration on gate signal SGm−1 according to gate signal SGm and clock CK5. Please note that Mth shift register stage 120 is the last shift register stage of shift register circuit 110.

In auxiliary circuit 150 of the embodiment shown in FIG. 1, first auxiliary transistor P1 has first terminal used for receiving clock CK2, gate terminal electrically connected to gate line GL1, and second terminal electrically connected to gate line GL2. First auxiliary transistor P2 has first terminal used for receiving clock CK3, gate terminal electrically connected to gate line GL2, and second terminal electrically connected to gate line GL3. Second auxiliary transistor Q2 has first terminal used for receiving clock CK1, gate terminal electrically connected to gate line GL2, and second terminal electrically connected to gate line GL1. First auxiliary transistor Pn−1 has first terminal used for receiving clock CK3, gate terminal electrically connected to gate line GLn−1, and second terminal electrically connected to gate line GLn. Second auxiliary transistor Qn−1 has first terminal used for receiving clock CK1, gate terminal electrically connected to gate line GLn−1, and second terminal electrically connected to gate line GLn−2. First auxiliary transistor Pn has first terminal used for receiving clock CK4, gate terminal electrically connected to gate line GLn, and second terminal electrically connected to gate line GLn+1. Second auxiliary transistor Qn has first terminal used for receiving clock CK2, gate terminal electrically connected to gate line GLn, and second terminal electrically connected to gate line GLn−1. First auxiliary transistor Pn+1 has first terminal used for receiving clock CK5, gate terminal electrically connected to gate line GLn+1, and second terminal electrically connected to gate line GLn+2. Second auxiliary transistor Qn+1 has first terminal used for receiving clock CK3, gate terminal electrically connected to gate line GLn+1, and second terminal electrically connected to gate line GLn. First auxiliary transistor Pm−1 has first terminal used for receiving clock CK6, gate terminal electrically connected to gate line GLm−1, and second terminal electrically connected to gate line GLm. Second auxiliary transistor Qm−1 has first terminal used for receiving clock CK4, gate terminal electrically connected to gate line GLm−1, and second terminal electrically connected to gate line GLm−2. First auxiliary transistor Qm has first terminal used for receiving clock CK5, gate terminal electrically connected to gate line GLm, and second terminal electrically connected to gate line GLm−1. Interconnections between other first auxiliary transistors 160 and second auxiliary transistors 170 can be derived similarly.

Figure 2:
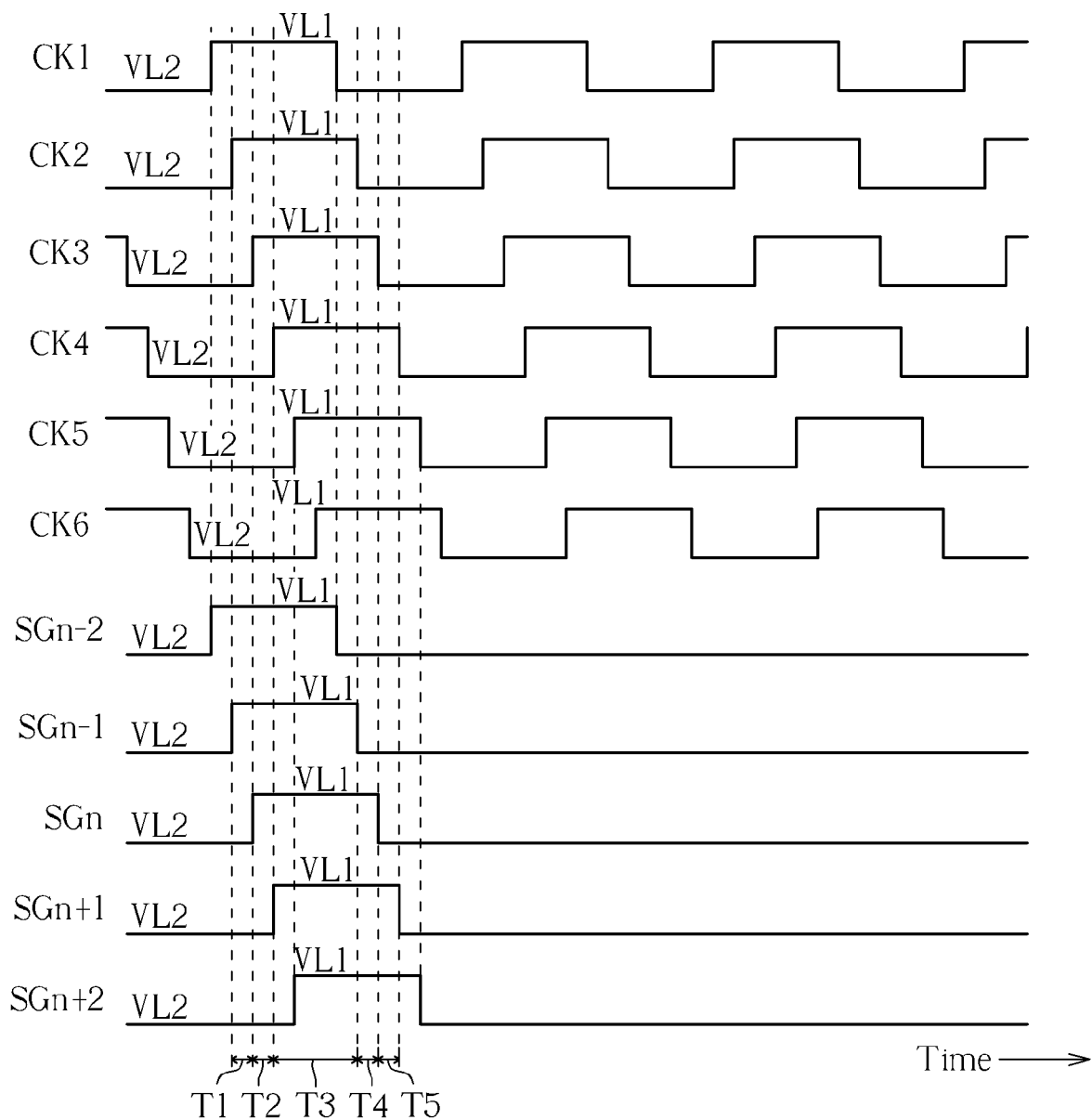
FIG. 2 is a waveform diagram showing related signals of the gate driving circuit of FIG. 1.

FIG. 2 is a waveform diagram showing related signals of the gate driving circuit of FIG. 1. The horizontal axis represents time. In FIG. 2, signals from top to bottom are clock CK1, clock CK2, clock CK3, clock CK4, clock CK5, clock CK6, gate signal SGn−2, gate signal SGn−1, gate signal SGn, gate signal SGn+1, and gate signal SGn+2. As shown in FIG. 2, waveforms of clocks CK1-CK6 are sequentially separated by 30 degree phase difference, and all clocks CK1-CK6 switch level periodically between first level VL1 and second level VL2 which are different. Referring to FIG. 2 and FIG. 1, in period T1, (N−1)th shift register stage 120 outputs gate signal SGn−1 having first level VL1, Nth shift register stage 120 outputs gate signal SGn having second level VL2, and (N+1)th shift register stage 120 outputs gate signal SGn+1 having second level VL2. At that time, first auxiliary transistor Pn−1 stabilizes gate signal SGn to second level VL2 according to gate signal SGn−1 having first level VL1 and clock CK3 having second level VL2, and second auxiliary transistor Qn−1 stabilizes gate signal SGn−2 to first level VL1 according to gate signal SGn−1 having first level VL1 and clock CK1 having first level VL1. In period T2, (N−1)th shift register stage 120 outputs gate signal SGn−1 having first level VL1, Nth shift register stage 120 outputs gate signal SGn having first level VL1, and (N+1)th shift register stage 120 outputs gate signal SGn+1 having second level VL2. At that time, first auxiliary transistor Pn−1 performs switching acceleration on gate signal SGn from second level VL2 to first level VL1 according to gate signal SGn−1 having first level VL1 and clock CK3 having first level VL1, first auxiliary transistor Pn stabilizes gate signal SGn+1 to second level VL2 according to gate signal SGn having first level VL1 and clock CK4 having second level VL2, second auxiliary transistor Qn stabilizes gate signal SGn−1 to first level VL1 according to gate signal SGn having first level VL1 and clock CK2 having first level VL1, and second auxiliary transistor Qn−1 stabilizes gate signal SGn−2 to first level VL1 according to gate signal SGn−1 having first level VL1 and clock CK1 having first level VL1.

In period T3, (N−1)th shift register stage 120 outputs gate signal SGn−1 having first level VL1, Nth shift register stage 120 outputs gate signal SGn having first level VL1, and (N+1)th shift register stage 120 outputs gate signal SGn+1 having first level VL1. At that time, first auxiliary transistor Pn−1 stabilizes gate signal SGn to first level VL1 according to gate signal SGn−1 having first level VL1 and clock CK3 having first level VL1, first auxiliary transistors Pn perform switching acceleration on gate signal SGn+1 from second level VL2 to first level VL1 according to gate signal SGn having first level VL1 and clock CK4 having first level VL1, second auxiliary transistor Qn stabilizes gate signal SGn−1 to first level VL1 according to gate signal SGn having first level VL1 and clock CK2 having first level VL1, and second auxiliary transistor Qn+1 stabilizes gate signal SGn to first level VL1 according to gate signal SGn+1 having first level VL1 and clock CK3 having first level VL1.

In period T4, (N−1)th shift register stage 120 outputs gate signal SGn−1 having second level VL2, Nth shift register stage 120 outputs gate signal SGn having first level VL1, and (N+1)th shift register stage 120 outputs gate signal SGn+1 having first level VL1. At that time, second auxiliary transistor Qn+1 stabilizes gate signal SGn to first level VL1 according to gate signal SGn+1 having first level VL1 and clock CK3 having first level VL1, second auxiliary transistor Qn performs switching acceleration on gate signal SGn−1 from first level VL1 to second level VL2 according to gate signal SGn having first level VL1 and clock CK2 having second level VL2, first auxiliary transistor Pn stabilizes gate signal SGn+1 to first level VL1 according to gate signal SGn having first level VL1 and clock CK4 having first level VL1, and first auxiliary transistors Pn+1 stabilizes gate signal SGn+2 to first level VL1 according to gate signal SGn+1 having first level VL1 and clock CK5 having first level VL1. In period T5, (N−1)th shift register stage 120 outputs gate signal SGn−1 having second level VL2, Nth shift register stage 120 outputs gate signal SGn having second level VL2, and (N+1)th shift register stage 120 outputs gate signal SGn+1 having first level VL1. At that time, second auxiliary transistors Qn+1 performs switching acceleration on gate signal SGn from first level VL1 to second level VL2 according to gate signal SGn+1 having first level VL1 and clock CK3 having second level VL2, and first auxiliary transistors Pn+1 stabilizes gate signal SGn+2 to first level VL1 according to gate signal SGn+1 having first level VL1 and clock CK5 having first level VL1.

From the above it can be seen that in operation of gate driving circuit 100, distortion of all gate signals can be reduced through signal voltage stabilization and level switching acceleration performed by auxiliary circuit 150, thereby increasing pixel recharge time, and thus improving image display quality. Additionally, in each frame period, each auxiliary transistor 160/170 of auxiliary circuit 150 only conducts during the pulse period of the related gate signal, which prevents occurrence of transistor characteristic curve drift and improves operation stability.

Figure 3:
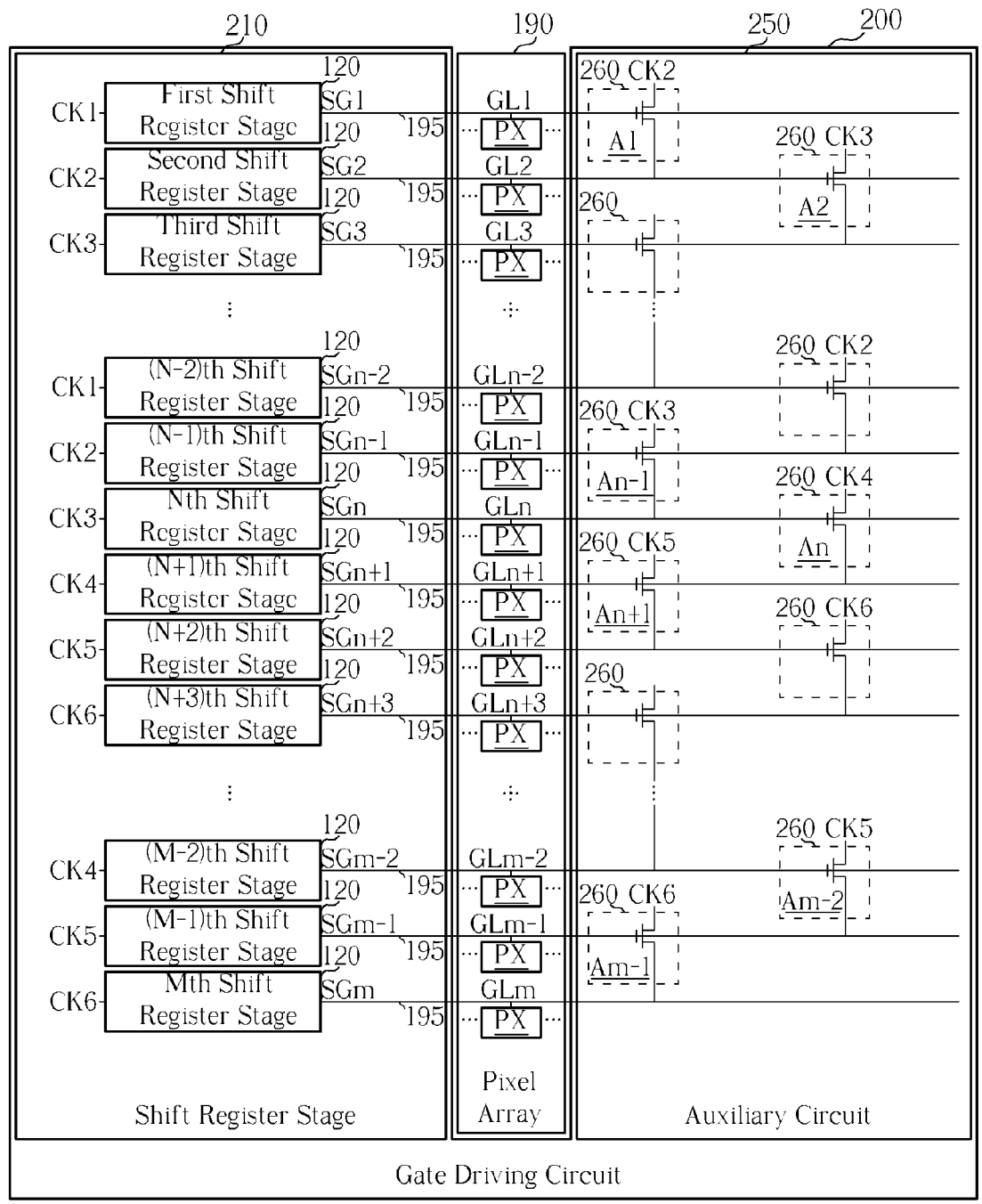
FIG. 3 is a circuit diagram of a gate driving circuit according to another embodiment.

FIG. 3 is a circuit diagram of a gate driving circuit according to another embodiment. As shown in FIG. 3, gate driving circuit 200 comprises shift register circuit 210 and auxiliary circuit 250. Shift register circuit 210 and auxiliary circuit 250 are disposed on two different sides of pixel array 190. Internal architecture and related operations of shift register circuit 210 are the same as those of shift register circuit 110 shown in FIG. 1, and are not described again here. Auxiliary circuit 250 is used for performing signal voltage stabilization and level switching acceleration on a plurality of gate signals SG1-SGm. Auxiliary circuit 250 comprises a plurality of first auxiliary transistors 260, each first auxiliary transistor 260 being used for performing signal voltage stabilization and level switching acceleration of a next gate signal according to the corresponding gate signal and the corresponding clock. For example, first auxiliary transistor A1 electrically connected to gate line GL1 and gate line GL2 performs signal voltage stabilization and level switching acceleration on gate signal SG2 according to gate signal SG1 and clock CK2. First auxiliary transistor A2 electrically connected to gate line GL2 and gate line GL3 performs signal voltage stabilization and level switching acceleration on gate signal SG3 according to gate signal SG2 and clock CK3. First auxiliary transistor An−1 electrically connected to gate line GLn−1 and gate line GLn performs signal voltage stabilization and level switching acceleration on gate signal SGn according to gate signal SGn−1 and clock CK3. First auxiliary transistor An electrically connected to gate line GLn and gate line GLn+1 performs signal voltage stabilization and level switching acceleration on gate signal SGn+1 according to gate signal SGn and clock CK4. First auxiliary transistor An+1 electrically connected to gate line GLn+1 and gate line GLn+2 performs signal voltage stabilization and level switching acceleration on gate signal SGn+2 according to gate signal SGn+1 and clock CK5. First auxiliary transistor Am−2 electrically connected to gate line GLm−2 and gate line GLm−1 performs signal voltage stabilization and level switching acceleration on gate signal SGm−1 according to gate signal SGm−2 and clock CK5. First auxiliary transistor Am−1 electrically connected to gate line GLm−1 and gate line GLm performs signal voltage stabilization and level switching acceleration on gate signal SGm according to gate signal SGm−1 and clock CK6.

In the auxiliary circuit 250 shown in FIG. 3, first auxiliary transistor A1 has first terminal used for receiving clock CK2, gate terminal electrically connected to gate line GL1, and second terminal electrically connected to gate line GL2. First auxiliary transistor A2 has first terminal used for receiving clock CK3, gate terminal electrically connected to gate line GL2, and second terminal electrically connected to gate line GL3. First auxiliary transistor An−1 has first terminal used for receiving clock CK3, gate terminal electrically connected to gate line GLn−1, and second terminal electrically connected to gate line GLn. First auxiliary transistor An has first terminal used for receiving clock CK4, gate terminal electrically connected to gate line GLn, and second terminal electrically connected to gate line GLn+1. First auxiliary transistors An+1 has first terminal used for receiving clock CK5, gate terminal electrically connected to gate line GLn+1, and second terminal electrically connected to gate line GLn+2. First auxiliary transistor Am−2 has first terminal used for receiving clock CK5, gate terminal electrically connected to gate line GLm−2, and second terminal electrically connected to gate line GLm−1. First auxiliary transistor Am−1 has first terminal used for receiving clock CK6, gate terminal electrically connected to gate line GLm−1, and second terminal electrically connected to gate line GLm. Interconnections between other first auxiliary transistors 260 can be derived similarly.

Related signals of gate driving circuit 200 are similar to those shown in FIG. 2. Referring to FIG. 2 and FIG. 3, in period T1, first auxiliary transistor An−1 stabilizes gate signal SGn to second level VL2 according to gate signal SGn−1 having first level VL1 and clock CK3 having second level VL2. In period T2, first auxiliary transistor An−1 performs switching acceleration on gate signal SGn from second level VL2 to first level VL1 according to gate signal SGn−1 having first level VL1 and clock CK3 having first level VL1. First auxiliary transistor An stabilizes gate signal SGn+1 to second level VL2 according to gate signal SGn having first level VL1 and clock CK4 having second level VL2. In period T3, first auxiliary transistor An−1 stabilizes gate signal SGn to first level VL1 according to gate signal SGn−1 having first level VL1 and clock CK3 having first level VL1. First auxiliary transistor An performs switching acceleration on gate signal SGn+1 from second level VL2 to first level VL1 according to gate signal SGn having first level VL1 and clock CK4 having first level VL1. In period T4, first auxiliary transistor An stabilizes gate signal SGn+1 to first level VL1 according to gate signal SGn having first level VL1 and clock CK4 having first level VL1. First auxiliary transistor An+1 stabilizes gate signal SGn+2 to first level VL1 according to gate signal SGn+1 having first level VL1 and clock CK5 having first level VL1. In period T5, first auxiliary transistor An+1 stabilizes gate signal SGn+2 to first level VL1 according to gate signal SGn+1 having first level VL1 and clock CK5 having first level VL1.

From the above, it can be seen that in operation of gate driving circuit 200, distortion of all gate signals can be reduced through signal voltage stabilization and level switching acceleration of auxiliary circuit 250, thereby increasing pixel recharging time, and also increasing image display quality. Additionally, in each frame period, all first auxiliary transistors 260 of auxiliary circuit 250 only conduct during the pulse period of the corresponding gate signal, which can prevent occurrence of transistor characteristic curve drift and increase operation stability.

Figure 4:
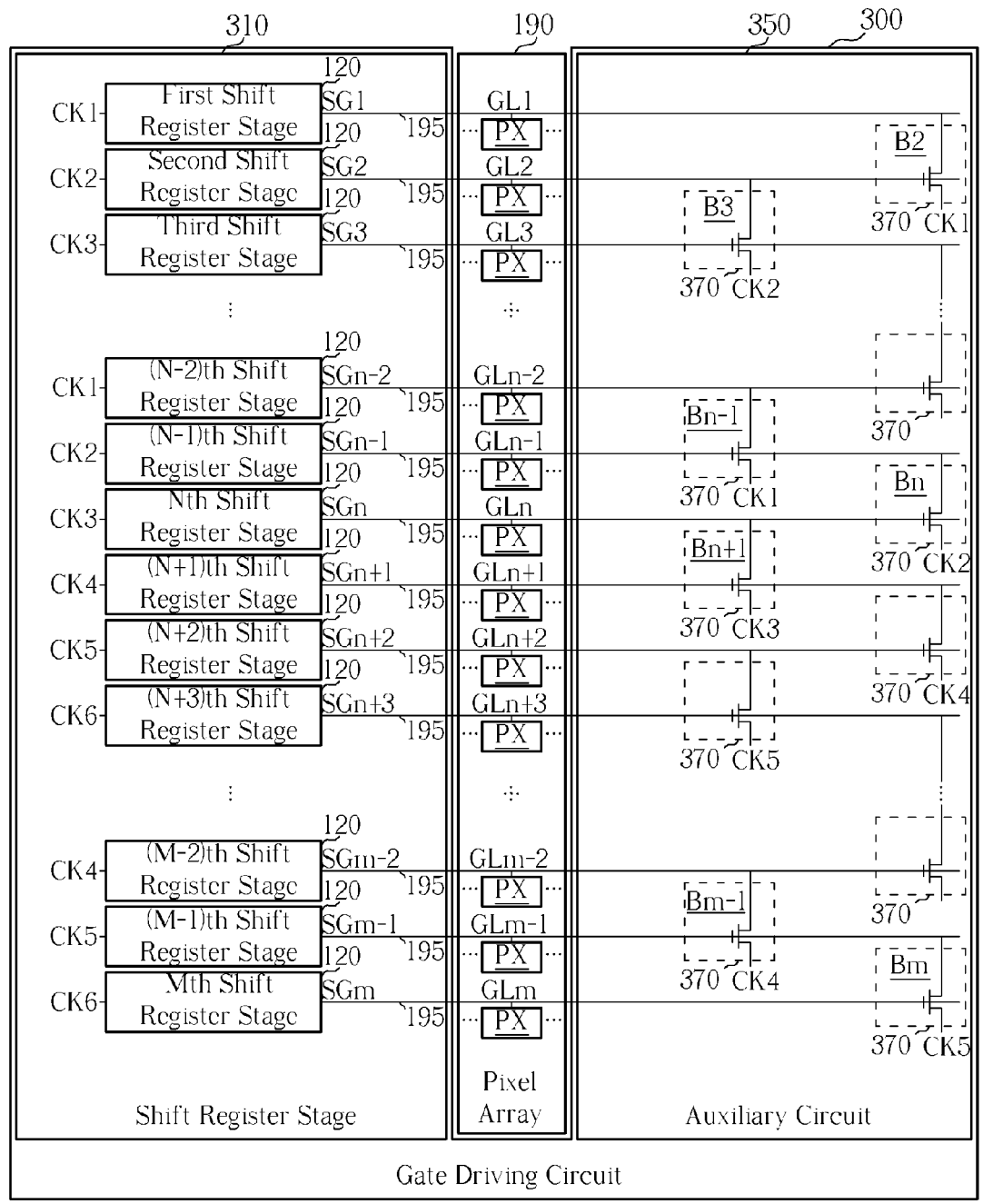
FIG. 4 is a diagram of a gate driving circuit according to another embodiment.

FIG. 4 is a diagram of a gate driving circuit according to another embodiment. As shown in FIG. 4, gate driving circuit 300 comprises shift register circuit 310 and auxiliary circuit 350. Shift register circuit 310 and auxiliary circuit 350 are disposed on two different sides of pixel array 190. Internal architecture and related functions of shift register circuit 310 are the same as those of shift register circuit 110 of FIG. 1, and not described here. Auxiliary circuit 350 is used for performing signal voltage stabilization and level switching acceleration on a plurality of gate signals SG1-SGm. Auxiliary circuit 350 comprises a plurality of second auxiliary transistors 370, each second auxiliary transistor 370 being used for performing signal voltage stabilization and level switching acceleration on the previous gate signal according to the corresponding gate signal and the corresponding clock. For example, second auxiliary transistor B2 electrically connected to gate line GL2 and gate line GL1 performs signal voltage stabilization and level switching acceleration on gate signal SG1 according to gate signal SG2 and clock CK1. Second auxiliary transistor B3 electrically connected to gate line GL3 and gate line GL2 performs signal voltage stabilization and level switching acceleration on gate signal SG2 according to gate signal SG3 and clock CK2. Second auxiliary transistor Bn−1 electrically connected to gate line GLn−1 and gate line GLn−2 performs signal voltage stabilization and level switching acceleration on gate signal SGn−2 according to gate signal SGn−1 and clock CK1. Second auxiliary transistor Bn electrically connected to gate line GLn and gate line GLn−1 performs signal voltage stabilization and level switching acceleration on gate signal SGn−1 according to gate signal SGn and clock CK2. Second auxiliary transistor Bn+1 electrically connected to gate line GLn+1 and gate line GLn performs signal voltage stabilization and level switching acceleration on gate signal SGn according to gate signal SGn+1 and clock CK3. Second auxiliary transistor Bm−1 electrically connected to gate line GLm−1 and gate line GLm−2 performs signal voltage stabilization and level switching acceleration on gate signal SGm−2 according to gate signal SGm−1 and clock CK4. Second auxiliary transistor Bm electrically connected to gate line GLm and gate line GLm−1 performs signal voltage stabilization and level switching acceleration on gate signal SGm−1 according to gate signal SGm and clock CK5.

In the auxiliary circuit 350 of FIG. 4, second auxiliary transistor B2 has first terminal used for receiving clock CK1, gate terminal electrically connected to gate line GL2, and second terminal electrically connected to gate line GL1. Second auxiliary transistor B3 has first terminal used for receiving clock CK2, gate terminal electrically connected to gate line GL3, and second terminal electrically connected to gate line GL2. Second auxiliary transistor Bn−1 has first terminal used for receiving clock CK1, gate terminal electrically connected to gate line GLn−1, and second terminal electrically connected to gate line GLn−2. Second auxiliary transistor Bn has first terminal used for receiving clock CK2, gate terminal electrically connected to gate line GLn, and second terminal electrically connected to gate line GLn−1. Second auxiliary transistor Bn+1 has first terminal used for receiving clock CK3, gate terminal electrically connected to gate line GLn+1, and second terminal electrically connected to gate line GLn. Second auxiliary transistor Bm−1 has first terminal used for receiving clock CK4, gate terminal electrically connected to gate line GLm−1, and second terminal electrically connected to gate line GLm−2. Second auxiliary transistor Bm has first terminal used for receiving clock CK5, gate terminal electrically connected to gate line GLm, and second terminal electrically connected to gate line GLm−1. Interconnections between other second auxiliary transistors 370 can be derived similarly.

Related signals of gate driving circuit 300 have waveforms similar to those shown in FIG. 2. Referring to FIG. 2 and FIG. 4, in period T1, second auxiliary transistor Bn−1 stabilizes gate signal SGn−2 to first level VL1 according to gate signal SGn−1 having first level VL1 and clock CK1 having first level VL1. In period T2, second auxiliary transistor Bn−1 stabilizes gate signal SGn−2 to first level VL1 according to gate signal SGn−1 having first level VL1 and clock CK1 having first level VL1. Second auxiliary transistor Bn stabilizes gate signal SGn−1 to first level VL1 according to gate signal SGn having first level VL1 and clock CK2 having first level VL1. In period T3, second auxiliary transistor Bn stabilizes gate signal SGn−1 to first level VL1 according to gate signal SGn having first level VL1 and clock CK2 having first level VL1. Second auxiliary transistor Bn+1 stabilizes gate signal SGn to first level VL1 according to gate signal SGn+1 having first level VL1 and clock CK3 having first level VL1. In period T4, second auxiliary transistor Bn performs switching acceleration on gate signal SGn−1 from first level VL1 to second level VL2 according to gate signal SGn having first level VL1 and clock CK2 having second level VL1. Second auxiliary transistor Bn+1 stabilizes gate signal SGn to first level VL1 according to gate signal SGn+1 having first level VL1 and clock CK3 having first level VL1. In period T5, second auxiliary transistor Bn+1 performs switching acceleration on gate signal SGn from first level VL1 to second level VL2 according to gate signal SGn+1 having first level VL1 and clock CK3 having second level VL1.

It can be seen from the above that, in operation of gate driving circuit 300, distortion of all gate signals can be reduced through signal voltage stabilization and level switching acceleration performed by auxiliary circuit 350, thereby increasing pixel recharge time, and thus improving image display quality. Additionally, in each frame period, each second auxiliary transistor 370 of auxiliary circuit 350 only conducts during the pulse period of the corresponding gate signal, which can prevent occurrence of transistor characteristic curve drift and increase operation stability.

Figure 5:
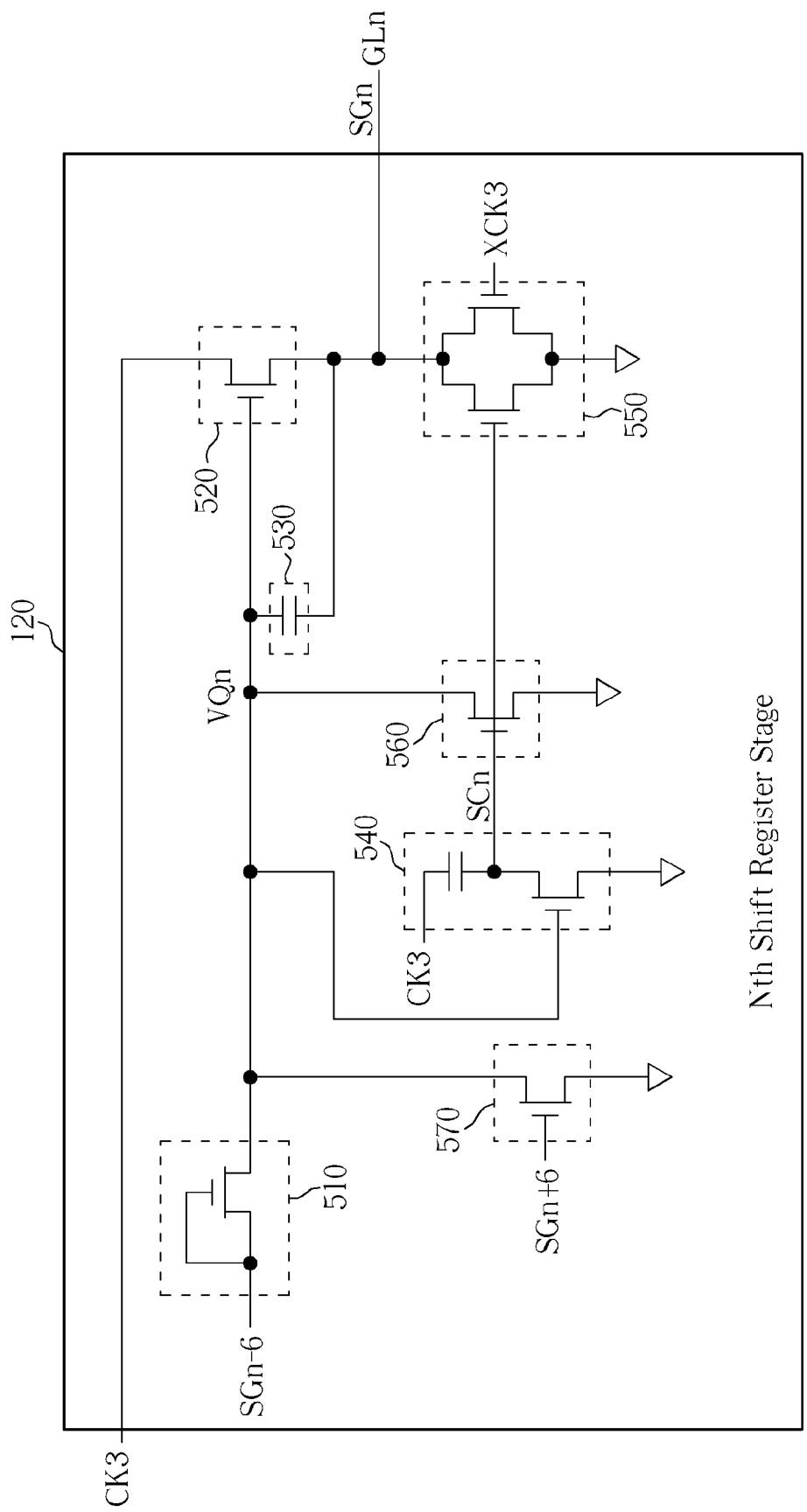
FIG. 5 is a diagram of an Nth shift register stage of FIG. 1, FIG. 3 and FIG. 4.

FIG. 5 is a diagram of an Nth shift register stage of FIG. 1, FIG. 3 and FIG. 4. As shown in FIG. 5, Nth shift register stage 120 comprises input unit 510, pull-up unit 520, energy storing unit 530, control unit 540, first pull-down unit 550, second pull-down unit 560, and third pull-down unit 570. Input unit 510 is used for outputting driving control voltage VQn according to gate signal SGn−6. Pull-up unit 520 is used for pulling up gate signal SGn of gate line GLn according to driving control voltage VQn and clock CK3. Energy storing unit 530 is used for performing charging/discharging procedures according to driving control voltage VQn. Control unit 540 is used for generating control signal SCn according to driving control voltage VQn and clock CK3. First pull-down unit 550 is used for pulling down gate signal SGn according to control signal SCn. First pull-down unit 550 can also pull down gate signal SGn according to clock XCK3 (inverse of clock CK3). Second pull-down unit 560 is used for pulling down driving control voltage VQn according to control signal SCn. Third pull-down unit 570 is used for pulling down driving control voltage VQn according to gate signal SGn+6. Internal structure and functions of other shift register stages 120 shown in FIG. 1, FIG. 3, and FIG. 4 can be derived according to the Nth shift register stage 120 shown in FIG. 5. Please note that internal architecture and functions of Nth shift register stage 120 are not limited to those shown in FIG. 5. Any functional circuit that can generate a plurality of gate signals having partially-overlapping pulses according to a plurality of clocks having partially-overlapping pulses can act as the shift register circuit of the gate driving circuit. Additionally, the gate driving circuit is not limited to using the clocks CK1-CK6 and the inverted clocks thereof to perform gate signal scanning operation. For example, gate signal scanning can also be based on a four system clock mechanism, as long as consecutive clocks have overlapping pulses.

Figure 6:
FIG. 6 is a flowchart showing a gate driving method based on the gate driving circuit of FIG. 1.

FIG. 6 is a flowchart showing a gate driving method based on the gate driving circuit of FIG. 1. As shown in FIG. 6, a process 700 of the gate driving method used in gate driving circuit 100 comprises the following steps:

Step S710: In first period, shift register circuit 110 outputs gate signal SGn−1 having first level, gate signal SGn having second level, and gate signal SGn+1 having second level to pixel array 190 and auxiliary circuit 150, where second level is different from first level;

Step S715: In first period, auxiliary circuit 150 stabilizes gate signal SGn to second level according to gate signal SGn−1 having first level and clock CK3 having second level;

Step S720: In second period following first period, shift register circuit 110 outputs gate signal SGn−1 having first level, gate signal SGn having first level, and gate signal SGn+1 having second level to pixel array 190 and auxiliary circuit 150;

Step S725: In second period, auxiliary circuit 150 performs switching acceleration on gate signal SGn from second level to first level according to gate signal SGn−1 having first level and clock CK3 having first level;

Step S730: In second period, auxiliary circuit 150 stabilizes gate signal SGn+1 to second level according to gate signal SGn having first level and clock CK4 having second level;

Step S735: In second period, auxiliary circuit 150 stabilizes gate signal SGn−1 to first level according to gate signal SGn having first level and clock CK2 having first level;

Step S740: In third period following second period, shift register circuit 110 outputs gate signal SGn−1 having first level, gate signal SGn having first level, and gate signal SGn+1 having first level to pixel array 190 and auxiliary circuit 150;

Step S745: In third period, auxiliary circuit 150 stabilizes gate signal SGn to first level according to gate signal SGn−1 having first level and clock CK3 having first level;

Step S750: In third period, auxiliary circuit 150 performs switching acceleration on gate signal SGn+1 from second level to first level according to gate signal SGn having first level and clock CK4 having first level;

Step S755: In third period, auxiliary circuit 150 stabilizes gate signal SGn−1 to first level according to gate signal SGn having first level and clock CK2 having first level;

Step S760: In third period, auxiliary circuit 150 stabilizes gate signal SGn to first level according to gate signal SGn+1 having first level and clock CK3 having first level;

Step S765: In fourth period following third period, shift register circuit 110 outputs gate signal SGn−1 having second level, gate signal SGn having first level, and gate signal SGn+1 having first level to pixel array 190 and auxiliary circuit 150;

Step S770: In fourth period, auxiliary circuit 150 stabilizes gate signal SGn to first level according to gate signal SGn+1 having first level and clock CK3 having first level;

Step S775: In fourth period, auxiliary circuit 150 performs switching acceleration on gate signal SGn−1 from first level to second level according to gate signal SGn having first level and clock CK2 having second level, thereby stabilizing gate signal SGn−1 at second level;

Step S780: In fourth period, auxiliary circuit 150 stabilizes gate signal SGn+1 to first level according to gate signal SGn having first level and clock CK4 having first level;

Step S785: In fifth period following fourth period, shift register circuit 110 outputs gate signal SGn−1 having second level, gate signal SGn having second level, and gate signal SGn+1 having first level to pixel array 190 and auxiliary circuit 150; and Step S790: In fifth period, auxiliary circuit 150 performs switching acceleration on gate signal SGn from first level to second level according to gate signal SGn+1 having first level and clock CK3 having second level, thereby stabilizing gate signal SGn to second level.

Figure 7:
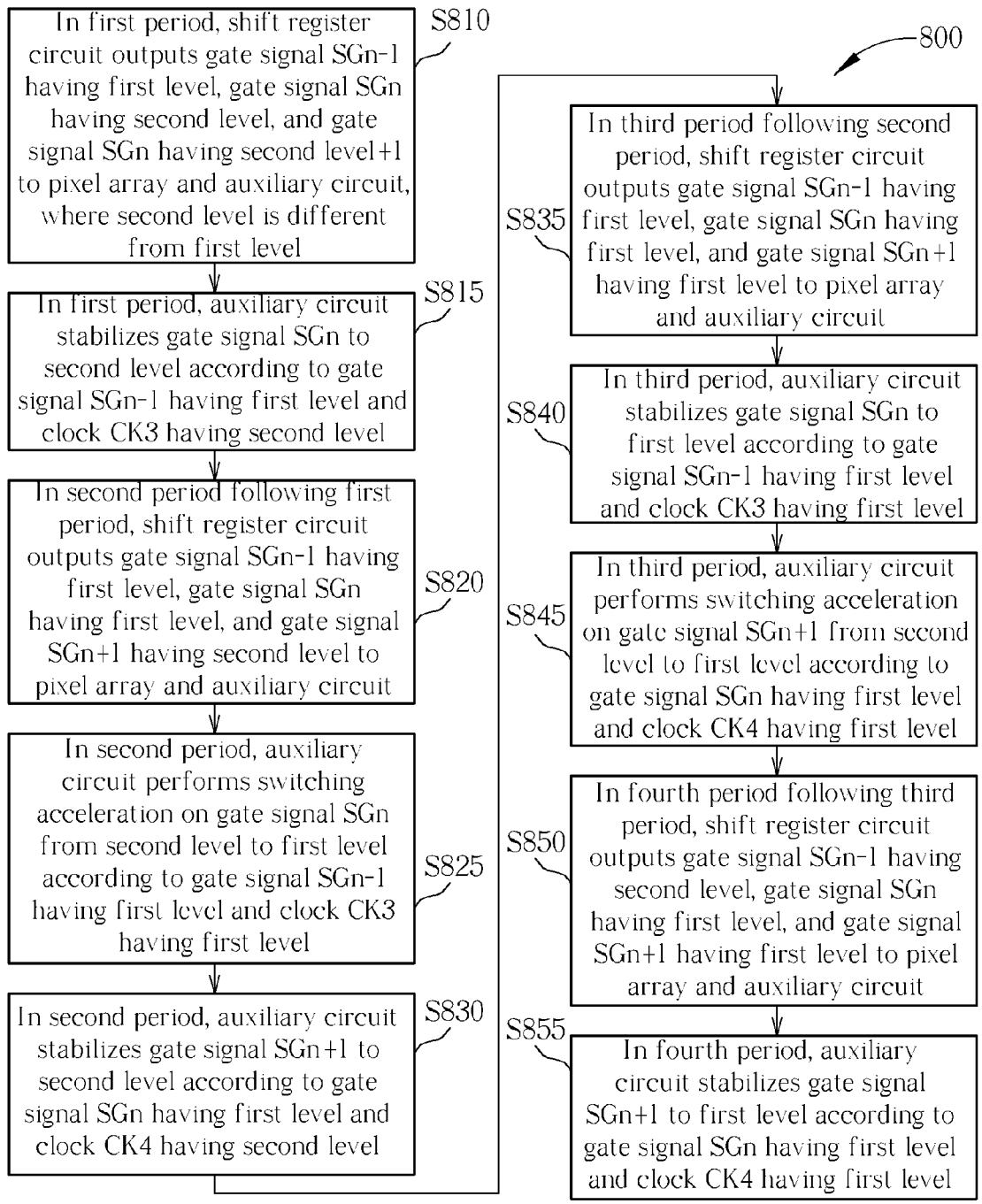
FIG. 7 is a flowchart of a gate driving method based on the gate driving circuit of FIG. 3.

FIG. 7 is a flowchart of a gate driving method based on the gate driving circuit of FIG. 3. As shown in FIG. 7, process 800 of the gate driving method used in gate driving circuit 200 comprises the following steps:

Step S810: In first period, shift register circuit 210 outputs gate signal SGn−1 having first level, gate signal SGn having second level, and gate signal SGn having second level+1 to pixel array 190 and auxiliary circuit 250, where second level is different from first level;

Step S815: In first period, auxiliary circuit 250 stabilizes gate signal SGn to second level according to gate signal SGn−1 having first level and clock CK3 having second level;

Step S820: In second period following first period, shift register circuit 210 outputs gate signal SGn−1 having first level, gate signal SGn having first level, and gate signal SGn+1 having second level to pixel array 190 and auxiliary circuit 250;

Step S825: In second period, auxiliary circuit 250 performs switching acceleration on gate signal SGn from second level to first level according to gate signal SGn−1 having first level and clock CK3 having first level;

Step S830: In second period, auxiliary circuit 250 stabilizes gate signal SGn+1 to second level according to gate signal SGn having first level and clock CK4 having second level;

Step S835: In third period following second period, shift register circuit 210 outputs gate signal SGn−1 having first level, gate signal SGn having first level, and gate signal SGn+1 having first level to pixel array 190 and auxiliary circuit 250;

Step S840: In third period, auxiliary circuit 250 stabilizes gate signal SGn to first level according to gate signal SGn−1 having first level and clock CK3 having first level;

Step S845: In third period, auxiliary circuit 250 performs switching acceleration on gate signal SGn+1 from second level to first level according to gate signal SGn having first level and clock CK4 having first level;

Step S850: In fourth period following third period, shift register circuit 210 outputs gate signal SGn−1 having second level, gate signal SGn having first level, and gate signal SGn+1 having first level to pixel array 190 and auxiliary circuit 250; and Step S855: In fourth period, auxiliary circuit 250 stabilizes gate signal SGn+1 to first level according to gate signal SGn having first level and clock CK4 having first level.

Figure 8:
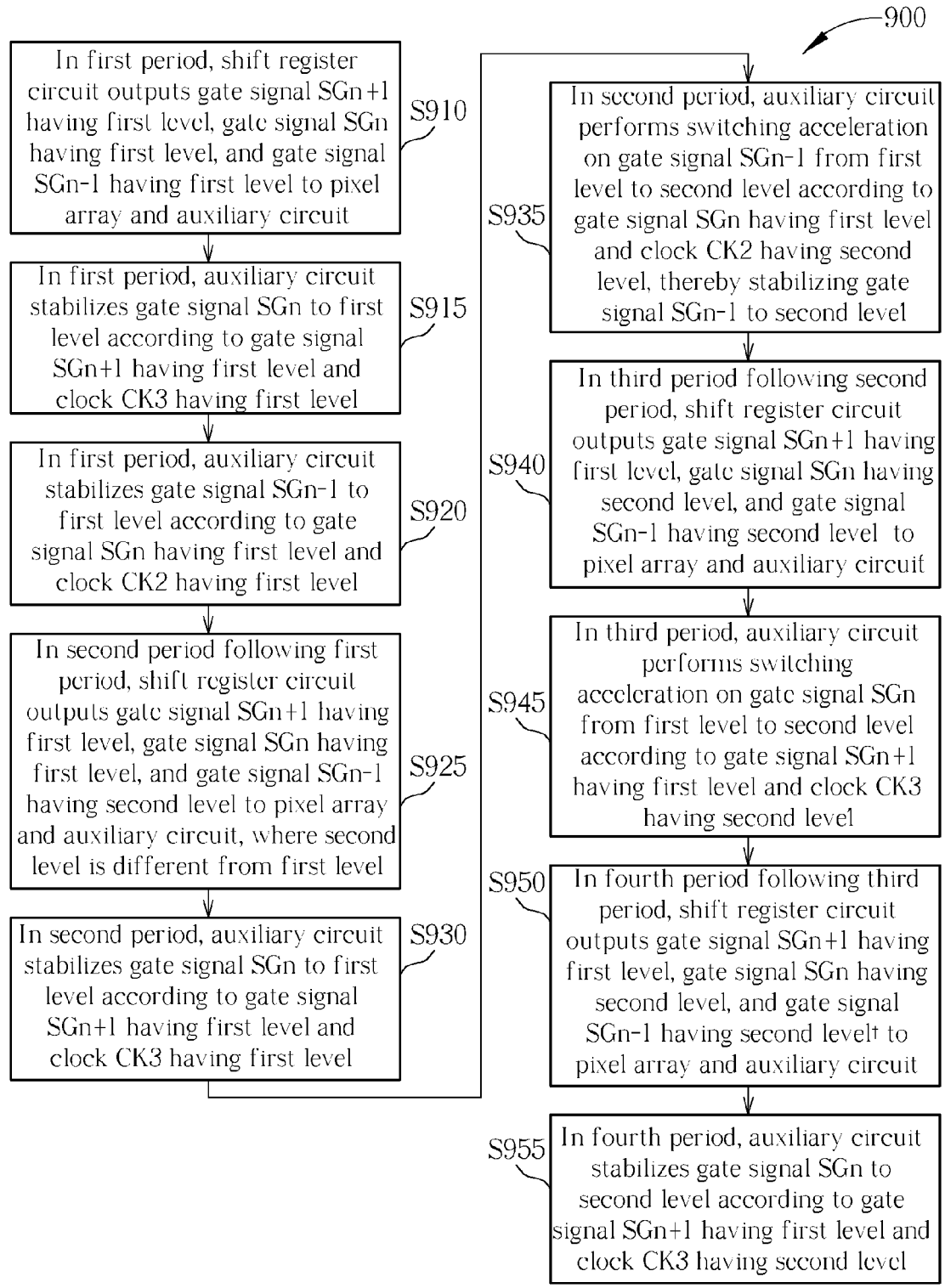
FIG. 8 is a flowchart of a gate driving method based on the gate driving circuit of FIG. 4.

FIG. 8 is a flowchart of a gate driving method based on the gate driving circuit of FIG. 4. As shown in FIG. 8, process 900 of the gate driving method used in gate driving circuit 300 comprises the following steps:

Step S910: In first period, shift register circuit 310 outputs gate signal SGn+1 having first level, gate signal SGn having first level, and gate signal SGn−1 having first level to pixel array 190 and auxiliary circuit 350;

Step S915: In first period, auxiliary circuit 350 stabilizes gate signal SGn to first level according to gate signal SGn+1 having first level and clock CK3 having first level;

Step S920: In first period, auxiliary circuit 350 stabilizes gate signal SGn−1 to first level according to gate signal SGn having first level and clock CK2 having first level;

Step S925: In second period following first period, shift register circuit 310 outputs gate signal SGn+1 having first level, gate signal SGn having first level, and gate signal SGn−1 having second level to pixel array 190 and auxiliary circuit 350, where second level is different from first level;

Step S930: In second period, auxiliary circuit 350 stabilizes gate signal SGn to first level according to gate signal SGn+1 having first level and clock CK3 having first level;

Step S935: In second period, auxiliary circuit 350 performs switching acceleration on gate signal SGn−1 from first level to second level according to gate signal SGn having first level and clock CK2 having second level, thereby stabilizing gate signal SGn−1 to second level;

Step S940: In third period following second period, shift register circuit 310 outputs gate signal SGn+1 having first level, gate signal SGn having second level, and gate signal SGn−1 having second level to pixel array 190 and auxiliary circuit 350;

Step S945: In third period, auxiliary circuit 350 performs switching acceleration on gate signal SGn from first level to second level according to gate signal SGn+1 having first level and clock CK3 having second level;

Step S950: In fourth period following third period, shift register circuit 310 outputs gate signal SGn+1 having first level, gate signal SGn having second level, and gate signal SGn−1 having second level to pixel array 190 and auxiliary circuit 350; and Step S955: In fourth period, auxiliary circuit 350 stabilizes gate signal SGn to second level according to gate signal SGn+1 having first level and clock CK3 having second level.

In summary of the above, gate driving circuits have a shift register circuit and an auxiliary circuit disposed on two sides of a pixel array, thereby reducing distortion of all gate signals through signal voltage stabilization and level switching acceleration of gate driving methods, which increases pixel charging time, and increases image display quality. Additionally, in each frame period, each auxiliary transistor of auxiliary circuit only conducts during pulse period of the corresponding gate signal, which can prevent occurrence of transistor characteristic curve drift and increase operation stability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate driving circuit for providing a plurality of gate signals to a plurality of gate lines of a pixel array, the gate driving circuit comprising:
a shift register circuit disposed on a first side of the pixel array, the shift register circuit feeding the gate signals from the first side into the pixel array, the shift register circuit comprising:
an (N−1)th shift register stage electrically connected to an (N−1)th gate line of the gate lines, the (N−1)th shift register stage used for according to a first clock generating an (N−1)th gate signal of the gate signals;
an Nth shift register stage electrically connected to an Nth gate line of the gate lines, the Nth shift register stage used for generating an Nth gate signal of the gate signals according to a second clock; and
an (N+1)th shift register stage electrically connected to an (N+1)th gate line of the gate lines, the (N+1)th shift register stage used for generating an (N+1)th gate signal of the gate signals according to a third clock; and an auxiliary circuit disposed on a second side of the pixel array different from the first side, the auxiliary circuit comprising:
a first transistor having a first terminal used for receiving the second clock, a gate terminal electrically connected to the (N−1)th gate line, and a second terminal electrically connected to the Nth gate line, wherein the (N−1)th gate line is configured to turn on the first transistor when the (N−1)th gate signal is of a high level and to turn off the first transistor when the (N−1) gate signal is of a low level; and
a third transistor having a first terminal used for receiving the second clock, a gate terminal electrically connected to the (N+1)th gate line, and a second terminal electrically connected to the Nth gate line;
wherein N is an integer greater than 1.

2. The gate driving circuit of claim 1, wherein the auxiliary circuit further comprises:
a second transistor having a first terminal used for receiving the third clock, a gate terminal electrically connected to the Nth gate line, and a second terminal electrically connected to the (N+1)th gate line.

3. The gate driving circuit of claim 1, wherein the first clock and the second clock have non-zero phase difference, the first clock and the third clock have non-zero phase difference, and the second clock and the third clock have non-zero phase difference.

4. The gate driving circuit of claim 1, wherein the auxiliary circuit further comprises:
a fourth transistor having a first terminal used for receiving the first clock, a gate terminal electrically connected to the Nth gate line, and a second terminal electrically connected to the (N−1)th gate line.

5. The gate driving circuit of claim 4, wherein the gate driving circuit is disposed in a panel having the pixel array; and the (N−1)th gate line is fed into the pixel array from the first side, then transmitted to the auxiliary circuit through the pixel array from the second side.

6. The gate driving circuit of claim 1, wherein the gate terminal of the first transistor is directly electrically connected to the (N−1)th gate line.

7. A gate driving circuit for providing a plurality of gate signals to a plurality of gate lines of a pixel array, the gate driving circuit comprising:
a shift register circuit disposed on a first side of the pixel array, the shift register circuit feeding the gate signals into the pixel array from the first side, the shift register circuit comprising:
an (N−1)th shift register stage electrically connected to an (N−1)th gate line of the gate lines, the (N−1)th shift register stage used for generating an (N−1)th gate signal of the gate signals according to a first clock;
an Nth shift register stage electrically connected to an Nth gate line of the gate lines, the Nth shift register stage for generating an Nth gate signal of the gate signals according to a second clock; and
an (N+1)th shift register stage electrically connected to an (N+1)th gate line of the gate lines, the (N+1)th shift register stage for generating an (N+1)th gate signal of the gate signals according to a third clock; and
an auxiliary circuit disposed on a second side of the pixel array different from the first side, the auxiliary circuit comprises:
a first transistor having a first terminal used for receiving the first clock, a gate terminal electrically connected to the Nth gate line, and a second terminal electrically connected to the (N−1)th gate line, wherein the Nth gate line is configured to turn on the first transistor when the Nth gate signal is of a high level and to turn off the first transistor when the Nth gate signal is of a low level; and a second transistor having a first terminal used for receiving the second clock, a gate terminal electrically connected to the (N+1)th gate line, and a second terminal electrically connected to the Nth gate line;

wherein N is an integer greater than 1.

8. The gate driving circuit of claim 7, wherein the first clock and the second clock have non-zero phase difference, the first clock and the third clock have non-zero phase difference, and the second clock and the third clock have non-zero phase difference.

9. The gate driving circuit of claim 7, wherein the gate terminal of the first transistor is directly electrically connected to the Nth gate line.

10. A gate driving method for use in driving a gate driving circuit having a shift register circuit and an auxiliary circuit, the shift register circuit used for providing a plurality of gate signals to a pixel array, the shift register circuit and the auxiliary circuit disposed on two different sides of the pixel array, the gate driving method comprising:

in a first period, the shift register circuit outputting an (N−1)th gate signal having first level and an Nth gate signal having a second level of the gate signals to the pixel array and the auxiliary circuit, wherein the second level is different from the first level;

in the first period, the auxiliary circuit stabilizing the Nth gate signal to the second level according to the (N−1)th gate signal having the first level and a first clock having the second level;

in a second period after the first period, the shift register circuit outputting the (N−1)th gate signal having the first level, the Nth gate signal having the first level, and an (N+1)th gate signal of the gate signals having the second level to the pixel array and the auxiliary circuit;

in the second period, the auxiliary circuit performing accelerated switching of the Nth gate signal from the second level to the first level according to the (N−1)th gate signal having the first level and the first clock having the first level;

in the second period, the auxiliary circuit stabilizing the (N+1)th gate signal to the second level according to the Nth gate signal having the first level and a second clock having the second level;

in a third period following the second period, the shift register circuit outputting the (N−1)th gate signal having the first level, the Nth gate signal having the first level, and the (N+1)th gate signal having the first level to the pixel array and the auxiliary circuit;

in the third period, the auxiliary circuit stabilizing the Nth gate signal to the first level according to the (N−1)th gate signal having the first level and the first clock having the first level;

in the third period, the auxiliary circuit performing accelerated switching of the (N+1)th gate signal from the second level to the first level according to the Nth gate signal having the first level and the second clock having the first level;

in a fourth period after the third period, the shift register circuit outputting the (N−1)th gate signal having the second level, the Nth gate signal having the first level, and the (N+1)th gate signal having the first level to the pixel array and the auxiliary circuit;

in the fourth period, the auxiliary circuit stabilizing the (N+1)th gate signal to the first level according to the Nth gate signal having the first level and the second clock having the first level; and when the (N−1)th gate signal has the second level, the (N−1)th gate signal making the auxiliary circuit stop stabilizing the Nth gate signal;

wherein N is an integer greater than 1.

11. The gate driving method of claim 10, further comprising:

in the second period, the auxiliary circuit stabilizing the (N−1)th gate signal to the first level according to the Nth gate signal having the first level and a third clock having the first level;

in the third period, the auxiliary circuit stabilizing the (N−1)th gate signal to the first level according to the Nth gate signal having the first level and the third clock having the first level;

in the third period, the auxiliary circuit stabilizing the Nth gate signal to the first level according to the (N+1)th gate signal having the first level and the first clock having the first level;

in the fourth period, the auxiliary circuit performing accelerated switching on the (N−1)th gate signal from the first level to the second level according to the Nth gate signal having the first level and the third clock having the second level, thereby stabilizing the (N−1)th gate signal to the second level; and in the fourth period, the auxiliary circuit stabilizing the Nth gate signal to the first level according to the (N+1)th gate signal having the first level and the first clock having the first level.

12. The gate driving method of claim 11, further comprising:

in a fifth period after the fourth period, the shift register circuit outputting the (N−1)th gate signal having the second level, the Nth gate signal having the second level, and the (N+1)th gate signal having the first level to the pixel array and the auxiliary circuit; and in the fifth period, the auxiliary circuit performing accelerated switching of the Nth gate signal from the first level to the second level according to the (N+1)th gate signal having the first level and the first clock having the second level, thereby stabilizing the Nth gate signal to the second level.

* * * * *